United States Patent [19]

Sun et al.

[11] Patent Number: 4,926,237
[45] Date of Patent: May 15, 1990

[54] DEVICE METALLIZATION, DEVICE AND METHOD

[75] Inventors: Shih W. Sun; Jen-Jiang Lee, both of Austin, Tex.

[73] Assignee: Motorola, Inc., Schaumburg, Ill.

[21] Appl. No.: 177,747

[22] Filed: Apr. 4, 1988

[51] Int. Cl.$^5$ .............................................. H01L 23/48
[52] U.S. Cl. ........................................ 357/71; 357/67
[58] Field of Search .................................... 357/71, 67

[56] References Cited

U.S. PATENT DOCUMENTS

| | | | |
|---|---|---|---|
| 4,164,461 | 8/1979 | Schilling | 357/71 |
| 4,582,563 | 4/1986 | Hazuki et al. | 357/71 R |
| 4,624,864 | 11/1986 | Hartmann | 357/71 |
| 4,751,563 | 1/1988 | Laibowitz et al. | 357/67 R |
| 4,818,723 | 4/1989 | Yen | 357/71 |
| 4,823,181 | 4/1989 | Mohsen et al. | 357/71 |

FOREIGN PATENT DOCUMENTS

| | | | |
|---|---|---|---|
| 0127281 | 12/1984 | European Pat. Off. | 357/71 |
| 45-32008 | 10/1970 | Japan | 357/71 R |
| 60-227469 | 11/1985 | Japan | 357/71 |
| 61-174767 | 8/1986 | Japan | 357/71 |
| 62-57234 | 3/1987 | Japan | 357/71 |
| 62-61358 | 3/1987 | Japan | 357/71 |

OTHER PUBLICATIONS

IEEE Journal of Solid-State Circuits, vol. SC-15, No. 4, Aug. 1980, Refractory Silicides of Ti and Ta for Low-Resistivity Gates and Interconnects, by Murarka et al.

Refractory Contact Stud, IBM Technical Disclosure Bulletin, vol. 29, No. 11, Apr. 1987.

S. W. Sun, et al., "Al/W/TiN$_x$/TiSi$_y$/Si Barrier Technology for 1.0 μm Contacts", IEEE Electron Device Letters, vol. 9, No. 2, Feb. 88, pp. 71–73.

S. W. Sun, et al., "Effects of TiS$_x$/TiN$_x$/Al Contact Metallization Process on the Shallow Junction Related Properties", Rapid Thermal Processing of Electrical Materials, Materials Research Soc., 1987, pp. 165–170.

Primary Examiner—Rolf Hille
Assistant Examiner—Steven Loke
Attorney, Agent, or Firm—John A. Fisher; Jasper W. Dockrey

[57] ABSTRACT

A semiconductor device, device metallization, and method are described. The device metallization, which is especially designed for submicron contact openings, includes titanium silicide to provide a low resistance contact to a device region, titanium nitride and sputtered tungsten to provide a diffusion barrier, etched back chemical vapor deposited tungsten for planarization, and aluminum or an aluminum alloy for interconnection.

18 Claims, 2 Drawing Sheets

DEVICE METALLIZATION, DEVICE AND METHOD

BACKGROUND OF THE INVENTION

This invention relates generally to device metallization, its use in a semiconductor device, and to a method for its fabrication, and more specifically to a multilayered device metallization suitable for use in small geometry semiconductor devices and to methods for its fabrication.

The semiconductor industry is characterized by a trend toward fabricating larger and more complex functions on a given semiconductor chip. The larger and more complex functions are achieved by reducing device sizes and spacing and by reducing the junction depth of regions formed in the semiconductor substrate. Among the feature sizes which are reduced in size are the width and spacing of interconnecting metal lines and the contact openings through which the metallization makes electrical contact to device regions. As the feature sizes are reduced, new problems arise which must be solved in order to economically and reliably produce the semiconductor devices.

As both the contact size and junction depth are reduced, a new device metallization process is required to overcome the problems which are encountered. Historically, device interconnections have been made with aluminum or aluminum alloy metallization. Aluminum, however, presents problems with junction spiking which result from dissolution of silicon in the aluminum metallization and aluminum in the silicon. This problem is exacerbated with the small device sizes because the shallow junction is easily shorted and because the amount of silicon available to satisfy the solubility requirements of the aluminum metallization is only accessed through the small contact area, increasing the resultant depth of the spike. Adding silicon to the aluminum metallization has helped to solve this problem, but has, in turn, resulted in silicon precipitation and other problems.

A variety of solutions have been attempted to overcome the problems inherent with aluminum metallization. For example, the device region exposed through a contact opening has been metallized with chemical vapor deposited (cvd) tungsten. The tungsten is deposited by the reduction of $WF_6$ with hydrogen. The $WF_6$, however, initially reacts with the silicon surface, employing silicon from the contact area in the region. This results in what has become known in the literature as "worm holes" or tunnels in the silicon which can also cause shorting of the underlying junction. The use of sputtered instead of cvd tungsten would overcome the problem of reaction with the silicon, but sputtered tungsten is unable to reduce any native oxide film which may be present on the surface of the device region. The remaining oxide film results in high contact resistance. A further attempt at solving this problem has employed the use of a reactive silicide to make the initial contact to the device region. The silicide is then contacted with aluminum. The silicide makes a low resistance contact to the silicon, but the silicide-aluminum contact has the same problem as does the use of aluminum directly on the silicon. Silicon from the silicide and from the underlying junction dissolves in the aluminum, resulting in aluminum spikes through the underlying junction.

Another problem which is exacerbated by the shrinking device sizes is that of unreliable step coverage by the device metallization as it traverses steps in the device topography and especially as the metallization traverses into the contact openings. It is therefore especially beneficial if the contact metallization provides a relatively planar surface to which the interconnect metallization can be applied.

It is therefore an object of this invention to provide an improved device metallization.

It is a further object of this invention to provide an improved semiconductor device structure.

It is yet another object of this invention to provide an improved process for fabricating semiconductor devices.

BRIEF SUMMARY OF THE INVENTION

The foregoing and other objects and advantages of the invention are achieved through the application and use of an improved multilayer device metallization. In accordance with one embodiment of the invention, a semiconductor device is fabricated by providing a silicon substrate in which device regions are formed at the surface. Contact openings are formed in an insulating layer which overlies the substrate surface to expose portions of the device regions. Layers of titanium and tungsten are sputtered onto the device surface and extend into the contact opening. Annealing these layers in nitrogen causes the formation of titanium silicide at the interface between the titanium and silicon and causes the formation of titanium nitride at the interface between the titanium and tungsten. The titanium nitride and the sputtered tungsten form a diffusion barrier which is impervious to the diffusion of silicon. A layer of chemical vapor deposited tungsten is then formed over the sputtered tungsten to substantially fill the contact opening. The chemical vapor deposited tungsten is etched back to form a substantially planar plug structure using the titanium nitride layer as an etch stop indicator. Aluminum is then applied and patterned to contact the tungsten plugs which fill the contact openings.

DETAILED DESCRIPTION OF PREFERRED EMBODIMENTS

The ideal device metallization provides a low resistance contact to a semiconductor device region, provides reliable interconnections, is easily patterned, and does not adversely react with the semiconductor substrate. A number of different materials, taken singly, provide one or more of the desirable qualities, but no single material meets all of the requirements. In accordance with the invention, a process is disclosed which provides all of the requirements for device metallization by using a multilayer structure. Process steps in accordance with the invention are illustrated in FIGS. 1-5.

Figure 1:
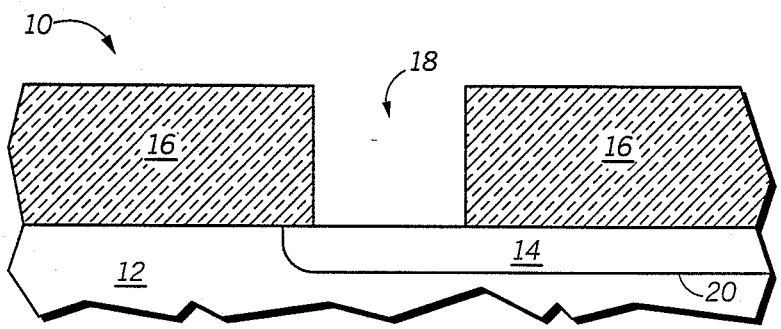
FIGS. 1-5 illustrate, in cross-section, process steps for providing devie metallization and for fabricating semiconductor devices in accordance with the invention.

FIG. 1 illustrates schematically, in cross-section, a portion of a semiconductor device 10 at an initial stage in production. Device 10 includes a semiconductor substrate 12 in which is formed a device region 14. Overlying substrate 12 is an insulating layer 16 having a contact opening 18 formed therethrough and exposing a portion of device region 14. Device 10 can be a portion of an integrated circuit or even an area in a discrete semiconductor device.

For purposes of illustrating the invention, substrate 12 is a monocrystalline silicon substrate and region 14 is formed at the surface of substrate 12 by diffusion, ion implantation, or the like. Region 14 is either N-type or P-type and forms a metallurgical junction 20 with substrate 12. Region 14 will be one of many device regions formed in the totality of the semiconductor device with the exact number, pattern, and distribution of such regions being determined by the function implemented by the semiconductor device. Insulating layer 16 is an oxide, nitride, doped glass, or other insulating material well known in the semiconductor art. Opening 18 is formed by chemically etching a patterned opening through insulator 16 by using a photolithographic process. In one embodiment, insulator 16 is a boronphosphosilicate glass having a thickness of several hundred nanometers to more than one micrometer and contact opening 18 has a diameter of 1 micrometer or less. Region 14 is characterized by a junction depth in the order of hundreds of nanometers.

Figure 2:
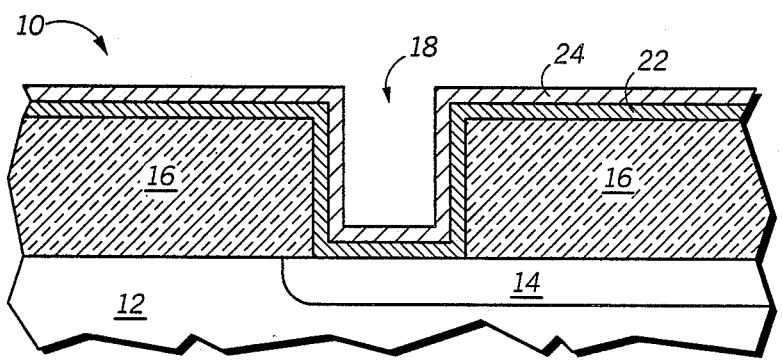

As illustrated in FIG. 2, in accordance with a preferred embodiment of the invention, the process continues with the sputter deposition of a layer of titanium 22 over the surface of insulator 16 and extending into contact opening 18 to contact the exposed portion of device region 14. Titanium layer 22 preferably has a thickness of 10-100 nanometers. The application of titanium layer 22 is followed by the sputter deposition of a layer of tungsten 24, also having a thickness of about 10-100 nanometers. The layers of titanium and tungsten are deposited sequentially in a sputtering apparatus without opening the apparatus and without exposing the newly deposited titanium layer to room ambient. The tungsten is thus deposited on a fresh and clean titanium layer before any detrimental films can be formed on the titanium which might cause a high contact resistance between the two metal layers.

Figure 3:
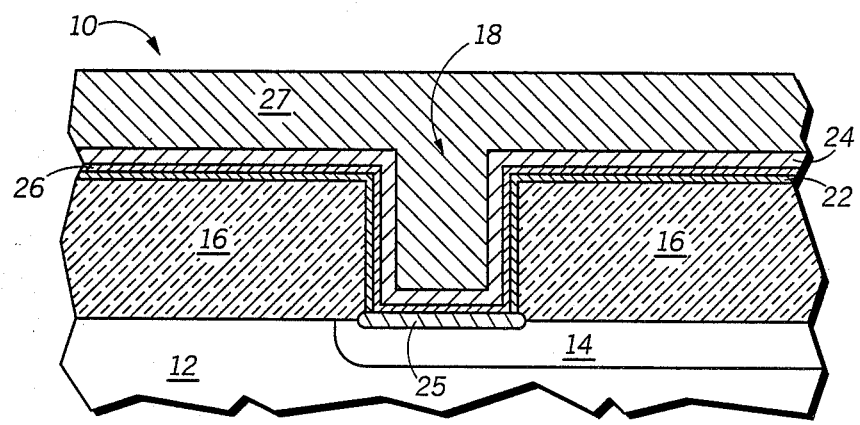

In the preferred embodiment whereby layer 22 is a layer of titanium, the process is continued by heating the structure in a nitrogen ambient to cause both the formation of titanium silicide 25 at the titanium-silicon interface and the formation of titanium nitride 26 at the titanium-tungsten interface as illustrated in FIG. 3. This is accomplished, for example, by heating the structure in nitrogen or a nitrogen containg ambient such as ammonia at about 650° C. for 20 minutes. During the heat treatment, the nitrogen diffuses through the layer of sputtered tungsten and reacts with the titanium to form a layer of titanium nitride. The original central portion of the titanium either remains as pure titanium or becomes a ternary silicide of composition $TiN_xSi_y$ (not shown) depending on the thickness of the titanium and the length of the anneal cycle. The overlying layer of tungsten helps to prevent oxidation of the titanium which might otherwise occur as a result of ambient contamination during the thermal processing.

Thermal processing in other ambients or with silicide forming materials other than titanium will still cause the formation of the metal silicide region at the surface of the device region, but will not form the nitride coating. The formation of the titanium nitride, however, is a desirable feature of the preferred embodiment because the nitride layer under the sputtered tungsten further enhances the barrier property of the structure. When using titanium, the titanium nitride and its attendant benefits are achieved without additional process complexity since formation of the silicide by thermal annealing is necessary to reduce the contact resistance.

The process is continued, as further illustrated in FIG. 3, by depositing a thick blanket layer of tungsten 27 over the sputtered tungsten layer. Thick tungsten layer 27 is deposited by chemical vapor deposition (cvd) to a sufficient thickness to insure that opening 18 is completely filled with a conductive matrial. The cvd tungsten is physically characterized by its different grain size as compared to that of sputtered tungsten. During the chemical vapor deposition of tungsten layer 27, the sputtered tungsten layer 24 prevents the formation of any insulating fluoride layer beneath the cvd tungsten layer which might be caused by the reaction of the $WF_6$ with any of the underlying materials.

Figure 4:
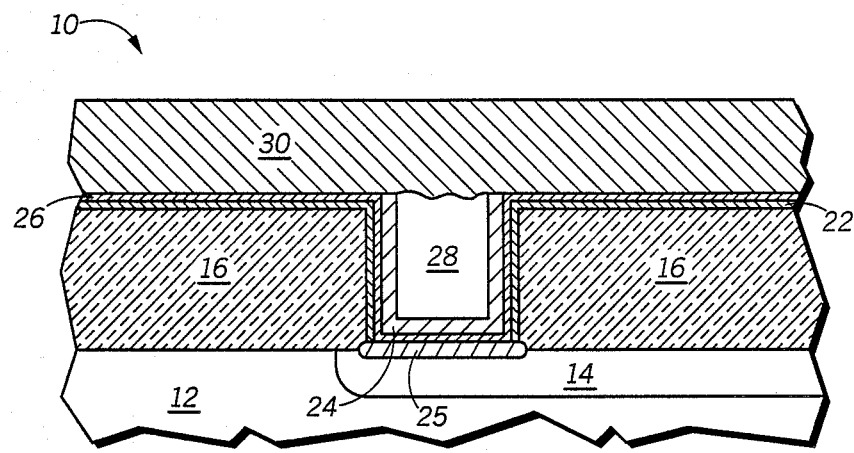

It is necessary to have a highly conductive film interconnecting device regions and providing electrical interconnection between device regions and bonding pads which are usually located on the periphery of the chip. The interconnect metallization must be amenable to patterning into narrow, closely spaced lines. The metallization must also be sufficiently malleable to allow wire bonds to be attached at the bonding pads. The thick cvd tungsten layer 27 is too resistive and too hard to meet these criteria. In addition, it is difficult to pattern. Accordingly, it is desirable to use aluminum or an alloy of aluminum (hereafter referred to collectively as aluminum) as the interconnect metallization. The device structure is prepared for the application of a layer of aluminum for the patterned interconnect metallization by etching back the cvd tungsten to remove substantially all of the cvd tungsten which was positioned above the insulating layer 16, leaving only "plugs" of the cvd tungsten filling the openings 18. The result of such an etch back is illustrated in FIG. 4 where plug 28 of cvd tungsten now fills the opening 18. The cvd tungsten is etched back in a plasma etchant such as $SF_6$ or $CBrF_3$. The plasma etching is optically monitored and the etching is terminated when the monitor indicates the presence of a titanium nitride line at 620 nanometers. This indicates that all, or substantially all, of the cvd tungsten lying over the insulating material 16 has been removed and titanium nitride layer 26 has been exposed. The presence of an endpoint detector such as the appearance of the 620 nm line which signals the completion or near completion of the etching of the tungsten and the subsequent exposure of the titanium nitride layer is important in this etch back step because control of the end of the etching is critical. Otherwise, overetching and the loading effects of this etch chemistry would cause the rapid etching, and thus the removal, of the tungsten plugs after the major portion of the tungsten has been removed. As further indicated in FIG. 4, a layer of aluminum 30 is applied, for example by sputtering, overlying the surface of the structure and contacting the cvd tungsten plugs. Because of the presence of the plugs, the aluminum does not have to directly contact the device regions and does not have to fill openings 18. Further, because the cvd tungsten plugs are substantially planar with the top surface of insulating layer 16, the aluminum does not have to transit into the contact openings with possible loss of continuity at the contact opening edge.

Figure 5:
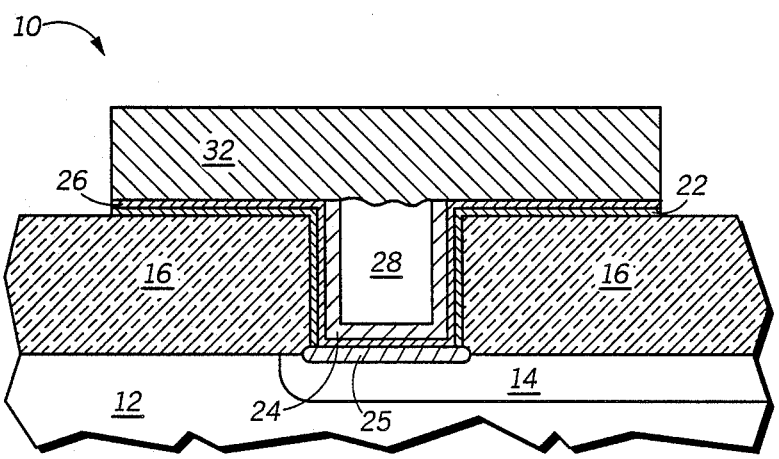

As illustrated in FIG. 5, the semiconductor device is completed by patterning aluminum layer 30 to form the required device connections and interconnections 32 consistent with the device function being implemented. The aluminum metallization and any remaining titanium nitride and titanium underlying the aluminum are patterned in a single photolithographic patterning step. The titanium nitride and titanium are patterned by the same etchant as is used for the aluminum. For example, the patterning can be accomplished by plasma etching in $Cl_2$ and $BCl_3$. As an added benefit of the invention, the resulting aluminum/titanium nitride/titanium interconnect metallization is more resistant to electromigration than is aluminum metallization alone. FIG. 5 illustrates the completed device contact structure which provides contact to a device region 14 through an opening in an insulating layer 16. In the preferred embodiment, the device contact includes titanium silicide 25 directly in contact with device region 14, a barrier layer including a layer of titanium nitride 26 and a layer of sputtered tungsten 24, a conductive plug 28, and patterned interconnect metallization 32.

The foregoing has provided a description of a preferred embodiment for practice of the invention. A number of other materials can be used which differ from this preferred embodiment and yet still fall within the invention. For example, although titanium is the preferred contact metallization, other materials can also be used. In accordance with the invention, the other materials must be reactive enough to reduce any native oxide formed on the surface of the device region 14 to insure a low resistance electrical contact thereto. Other suitable materials include, for example, cobalt. Similarly, other materials than cvd tungsten can be used for forming the plug. The plug material must be highly conductive, easily and rapidly deposited, and conformal. Other suitable materials include, for example, molybdenium. Aluminum or an aluminum alloy is the preferred choice for the interconnect metallization 32. The preferred metallization includes alloys of aluminum with small amounts of silicon, copper, and the like. Other interconnect metals include, for example, copper and alloys of copper. Each of these variations provide a device metallization and can be used in the fabrication of semiconductor devices in accordance with the invention.

Thus it is apparent that there has been provided, in accordance with the invention, a device metallization, a device structure, and a method for fabricating a device structure which fully meet the objects and advantages set forth above. The invention has been described with particular reference to specific embodiments thereof, but it is not intended that the invention be limited to those illustrative embodiments. It will be apparent to those skilled in the art that variations and modifications may be made which still fall within the spirit of the invention. For example, the invention is not to be limited to the particular thicknesses, etchants, and the like which have been set forth to fully describe the invention. Accordingly, it is intended that all such variations and modifications as fall within the scope of the appended claims be included within the invention.

What is claimed is:

1. Metallization for contacting the silicon substrate of a semiconductor device comprising:
    titanium silicide in contact with selected portions of the silicon substrate;
    a layer of titanium nitride overlying said titanium silicide;
    a layer of insitu sputtered tungsten disposed on and in intimate contact with said titanium nitride;
    a localized layer of chemical vapor deposited tungsten overlying said layer of sputtered tungsten; and
    a patterned layer comprising aluminum contacting said layer of chemical vapor deposited tungsten.

2. The metallization of claim 1 wherein said layer of titanium nitride and said layer of sputtered tungsten together have a thickness sufficient to prevent the diffusion of silicon therethrough.

3. Metallization for contacting the silicon substrate of a semiconductor device comprising:
    a silicide layer electrically contacting the silicon substrate;
    a diffusion barrier layer comprising insitu sputtered tungsten disposed on and in intimate contact with said silicide layer and preventing the diffusion of silicon therethrough;
    a planarizing plug of conductive material overlying said diffusion barrier layer; and
    a layer of interconnect metallization making selective electrical contact to said planarizing plug wherein said interconnect metallization comprises a material different from said conductive material.

4. The metallization of claim 3 wherein said silicide layer is selected from the group consisting of titanium silicide and cobalt silicide.

5. Metallization for contacting the silicon substrate of a semiconductor device comprising:
    a silicide layer electrically contacting the silicon substrate;
    a diffusion barrier layer of titanium nitride overlying said silicide layer and preventing the diffusion of silicon therethrough;
    a planarizing plug of conductive material overlying said diffusion barrier layer; and
    a layer of interconnect metallization selectively contacting said planarizing plug.

6. The metallization of claim 5 wherein said diffusion barrier further comprises a layer of sputtered tungsten overlying said titanium nitride.

7. The metallization of claim 5 wherein said planarizing layer comprises chemical vapor deposited tungsten.

8. The metallization of claim 5 wherein said planarizing layer comprises molybdenum.

9. The metallization of claim 8 wherein said layer of interconnect metallization comprises a material different from said conductive material.

10. A semiconductor device comprising:
    a silicon substrate including device regions;
    an insulating material overlying said substrate and having openings therethrough exposing selected portions of said device regions;
    titanium silicide formed on and electrically contacting said selected portions;
    a layer of titanium nitride overlying said titanium silicide;
    a layer of insitu sputtered tungsten disposed on and in intimate contact with said titanium nitride;
    a planarizing plug of chemically vapor deposited tungsten overlying said sputtered tungsten and substantially filling said opening; and
    a layer of patterned aluminum selectively contacting said chemically vapor deposited tungsten.

11. The semiconductor device of claim 10 wherein said insulating material comprises boronphosphosilicate glass.

12. The semiconductor device of claim 10 wherein said openings have a diameter of less than 1 micrometer.

13. A semiconductor device comprising:
    a silicon substrate including device regions;

an insulating material overlying said substrate and having openings therethrough exposing selected portions of said device regions;

a silicide material formed on and electrically contacting said selected portions;

a silicon diffusion barrier layer comprising a layer of titanium nitride and a layer of insitu sputtered tungsten disposed on and in intimate contact with said titanium nitride overlying said silicide layer;

a conductive plug overlying said diffusion barrier layer and substantially filling said openings; and a patterned layer of aluminum overlying said insulating material and selectively contacting said conductive layer.

14. The semiconductor device of claim 13 wherein said device comprises an integrated circuit.

15. The semiconductor device of claim 13 wherein the top surface of said conductive material is substantially planar with the top of said insulating material.

16. The semiconductor device of claim 13 wherein said silicide comprises a material selected from the group consisting of titanium silicide and cobalt silicide.

17. The semiconductor device of claim 13 wherein said silicide comprises titanium silicide and said barrier material comprises titanium nitride.

18. The semiconductor device of claim 13 wherein said conductive plug is selected form the group consisting of chemical vapor deposited tungsten and molybdenum.

* * * * *

UNITED STATES PATENT AND TRADEMARK OFFICE
CERTIFICATE OF CORRECTION

PATENT NO. : 4,926,237
DATED : May 15, 1990
INVENTOR(S) : Shih W. Sun and Jen-Jiang Lee It is certified that error appears in the above-identified patent and that said Letters Patent is hereby corrected as shown below:

Column 6, Line 43 change "claim 8" to --claim 5--.

Signed and Sealed this

Twenty-seventh Day of October, 1992

Attest:

DOUGLAS B. COMER

*Attesting Officer*  *Acting Commissioner of Patents and Trademarks*